United States Patent
Goggins

Patent Number: 5,617,178
Date of Patent: *Apr. 1, 1997

[54] METHOD OF PRODUCING MULTIDIMENSIONAL LITHOGRAPHIC SEPARATIONS FREE OF MOIRE INTERFERENCE

[75] Inventor: Timothy P. Goggins, Nashota, Wis.

[73] Assignee: National Graphics, Inc., Brookfield, Wis.

[*] Notice: The term of this patent shall not extend beyond the expiration date of Pat. No. 5,488,451.

[21] Appl. No.: 593,252

[22] Filed: Jan. 29, 1996

Related U.S. Application Data

[63] Continuation of Ser. No. 237,074, May 3, 1994, Pat. No. 5,488,451.

[51] Int. Cl.$^6$ ............................ G03B 35/14; G03B 27/32
[52] U.S. Cl. .................................. 355/22; 355/77
[58] Field of Search ................. 355/22, 52, 77; 348/42; 358/450

[56] References Cited

U.S. PATENT DOCUMENTS

| | | | |
|---|---|---|---|
| Re. 35,029 | 9/1995 | Sandor | 355/22 |
| 5,113,213 | 5/1992 | Sandor et al. | 355/22 |
| 5,276,478 | 1/1994 | Morton | 355/22 |
| 5,278,608 | 1/1994 | Taylor et al. | 355/22 |
| 5,436,738 | 5/1995 | Manico | 358/503 |
| 5,448,322 | 9/1995 | Bacs, Jr. | 354/112 |
| 5,455,689 | 10/1995 | Taylor et al. | 358/450 |
| 5,479,270 | 12/1995 | Taylor | 358/488 |
| 5,488,451 | 1/1996 | Goggins | 355/77 |
| 5,500,712 | 3/1996 | Miyawaki et al. | 355/22 |
| 5,519,794 | 5/1996 | Sandor et al. | 382/285 |
| 5,543,874 | 8/1996 | Winnek | 354/112 |

*Primary Examiner*—Arthur T. Grimley
*Assistant Examiner*—Herbert Kerner
*Attorney, Agent, or Firm*—Whyte Hirschboeck Dudek S.C.

[57] ABSTRACT

Multidimensional lithographs which impart the illusions of depth and/or motion to a viewer are prepared by constructing and sequencing a plurality of electronic pages, preferably four or more; rasterizing, compressing and converting each page; interlacing the pages in a desired sequence; outputting the interlaced frames to an imaging device; and producing a lithographic separation from the imaging device. In the rasterization of each frame, nonbinary pixels are created that correspond to the resolution of the line count of the lenticular lens that will ultimately be applied to a print of the lithograph times the number of frames in the lithographic separation. The frames are compressed to an amount equal to the reciprocal of the number of frames from which the lithographic separation is prepared. In the converting step, the nonbinary pixels of the compressed frames are converted to individual color plates of binary pixels. The multidimensional lithographic separations are free of moire and screen interference.

3 Claims, 1 Drawing Sheet

LENTICULAR LENS

COMPOSITE IMAGE COMPRESSED

METHOD OF PRODUCING MULTIDIMENSIONAL LITHOGRAPHIC SEPARATIONS FREE OF MOIRE INTERFERENCE

This is a continuation of U.S. patent application Ser. No. 08/237,074 now U.S. Pat. No. 5,488,451 filed on May 3, 1994.

BACKGROUND OF THE INVENTION

1. Field of the Invention

This invention relates to lithography. In one aspect, the invention relates to a method of producing multidimensional lithographic separations while in another aspect, the invention relates to a method of producing such separations free of moire interference. In yet another aspect, the invention relates to producing lithographic motion pictures.

2. Description of the Related Art

Lithography is an old, well-known and well-practiced art. In its first life, lithographs were created by drawing on the surface of a limestone slab with an oily wash or greasy crayon. The surface was then washed with an acid such that the marked areas of the surfaces rejected water but retained ink. The stone was then set within a press and when brought in contact with paper, it printed the paper with the inked image. Within fifty years of its first development, metal plates began to replace the limestone slabs. Today, rotary presses have replaced flatbed presses, paper and plastic plates are in use, and the use of color inks commonplace.

As lithography grew in sophistication, so did its varied uses. Originally a technique of printing, with time it grew into a popular medium for artists. Where the first images were created by hand, today the images can be created by one or more of a wide variety of techniques, e.g., photographic, chemical etching, computer-controlled optical scanning and engraving, digital art, and the like. Modern day lithographs are ubiquitous in the print and advertising industries, as well as many others.

Historically lithographs were two dimensional creations like any other picture or photograph. Perception of depth was dependent upon the content of the picture itself. However as described in U.S. Pat. No. 5,266,995 to Quadracci, et al., three dimensionality can be imparted to an image by first creating the image with a special stereoscopic camera and then overlaying the image with a lenticular lens sheet. Both the stereoscopic cameras and lenticular lens sheets are known in the art and are commercially available.

U.S. Pat. No. 5,113,213 to Sandor, et al. teaches a method of preparing three dimensional lithographs through the use and manipulation of computer images. In this technique, the images are interleaved into a predetermined number of planar images, and then printed with a high-resolution output imaging device on a spacer, and a selected edge of each interleaved image is aligned with a predetermined direction of the spacer.

However imparting the fourth dimension, motion, to a static picture remains absent in the art.

SUMMARY OF THE INVENTION

According to this invention, multidimensional lithographic separations are prepared in a manner which can convey the illusions of depth and/or motion. As here used, "multidimensional lithographic separations" means separations that are three dimensional (depth) or four dimensional (motion, with or without depth). These separations are prepared by a method comprising the steps of:

A. Creating a plurality of electronic frames;
B. Ordering the frames into a desired sequence;
C. Rasterizing each frame at a nonbinary pixel resolution that corresponds to the resolution of the line count of a lenticular lens times the number of frames in the lithographic separation;
D. Compressing each frame such that the compres-sion of each frame is a function of the number of frames in the lithographic separation;
E. Converting the nonbinary pixels of the com-pressed frames to individual color plates of binary pixels;
F. Interlacing the frames in the desired sequence;
G. Transferring the interlaced frames to an imaging device; and
H. Producing a lithographic separation from the imaging device of step G.

The lithographic separations produced by the method of this invention are free of moire and screen interference and when viewed through the lenticular lens for which they were designed, impart an illusion of depth and/or motion to a viewer.

The concept of a lithographic motion picture, i.e., a lithograph that imparts the illusion of motion, can be explained by reference to motion films. These films consist of a series of still pictures and if these pictures are projected in the proper sequence and at the proper frequency (24 frames per second), then the illusion of motion is created. The human brain perceives real motion from a series of still pictures.

Lithographic motion pictures consist of a series of still pictures. The individual pictures are segmented, typically into columns, and the individual columns are then merged together in a desired sequence to form a composite picture or image. This segmenting and merging is accomplished with the use of a computer, and the composite picture is then outputted to a lithographic separation, e.g., a film, proof, etc. Once the composite image is transferred to any suitable substrate, e.g., paper stock, a lenticular lens is laminated to its surface. The lens (which is typically an array of identical spherically-curved surfaces embossed or otherwise formed on the front surface of a plastic sheet) refracts light from each picture in sequence as the viewer's angle of perception changes. The result is the perception of motion from a series of still pictures. The illusion of depth is created in a similar manner.

The lithographs of this invention can tell a story, show events over time, and an objective in perspective. The process of this invention is a direct lithographic process in that the creation of intermediate images is not required, thus eliminating the need to create intermediate art which would later require separation from the final composite image. Moreover, the process of this invention does not require the use of special dimensional cameras or photographic techniques.

DETAILED DESCRIPTION OF THE INVENTION

Figure 1:
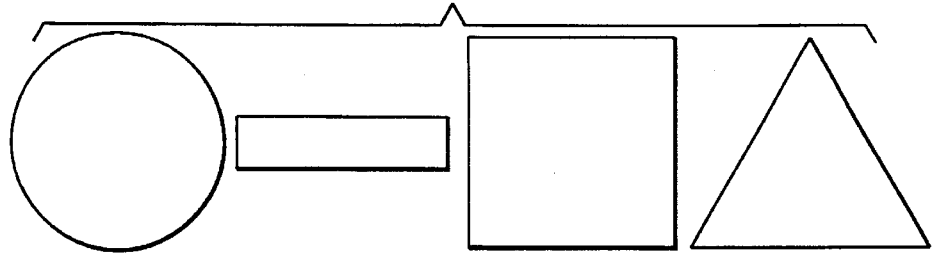
FIG. 1 is an illustration of four base images in sequence.

The lithographic separations of this invention are a composite of a series of still pictures or frames. The frames begin as either conventional print or art, e.g., text, photographs, etc., which are converted into electronic data, e.g., by optical scanning, etc., or are first created electronically, e.g., through the use of a software art program, a word processing program, etc. Once in electronic form, the frames are ordered in a sequence which will impart the desired illusion when the final lithographic print is joined to a lenticular lens. After ordering, each frame is preferably saved in a software file, e.g., a POSTSCRIPT™ file, rasterized, compressed, and then converted from nonbinary pixels to binary pixels. Once converted, the frames are then interlaced with one another in the desired sequence to form a composite picture or image, and then the composite picture is outputted to an imaging device, preferably a high-resolution imaging device. The resulting product is typically a film or proof which can be used to produce prints of the composite image which ultimately are joined to a lenticular lens. The "joining" is typically the lamination of the lens to the surface of the image, but this invention includes the printing of the composite image on the back or flat side of the lenticular lens itself. In this manner, the final lithograph can be displayed to a viewer through the use of back-lighting.

Lenticular lenses are known and commercially available. These lenses typically consist of an array of identical spherically-curved surfaces embossed or otherwise formed on the front surface of a plastic sheet (although other geometric patterns are known, e.g., pyramidical, and these too can be used in this invention). Each individual lens or lenticule is a long cylinder which typically extends the full length of the underlying image to which it is laminated. The back surface of the lens, i.e., the surface of the lens in contact with the underlying image, is flat.

In the conventional production of a computer-generated lithograph or lithographic separation, an electronic page is created. The page consists of a collection of page elements that are arranged in a desired order. The elements can be drawn from a wide variety of sources, e.g., photographs, original artwork, type, etc. The electronic page is then outputted to a half-tone film separation, i.e., a film bearing an image of the electronic page in a half-tone screen. Half-tone screens consist of an array of dots varying in size in relation to the tonal values of the elements of the page. These conventional lithographs are two dimensional, i.e., they possess length and width but not depth or motion.

Lithographs with three dimensionality can be produced photographic or computer-generated interlacing methods, but these methods suffer from problems of moire and screen interference. These methods are more fully described in U.S. Pat Nos. 5,266,995 and 5,113,213.

Moire interference is an undesirable pattern resulting from the overlapping of two or more grid patterns including the halftone dots in a film separation.

Screen interference is the broken appearance of detail, lines or image edges caused by halftone dots that are too coarse in comparison to the line or edge being drawn by the halftone dots. Screen interference is also known as stair-stepping or jaggies. The appearance of screen interference within an image is often interpreted as a moire. Images containing repetitive lines often exhibit this type of interference, for example fabrics, pin stripping, etc. The lines created in the interlacing phase of the current three dimensional methods are a major source of moire and screen interference.

In this invention, stochastic or frequency-modulated techniques are employed which virtually eliminate moire and screen interference. This improvement is the result of a direct pixel to pixel relationship. Stochastic screening yields a resolution which is four times greater than that of a conventional halftone dot because each quadrant of the conventional halftone dot is produced as an individual spot. Stochastic screening eliminates the merging of four pixels into a single dot, screen rotation and the formation rosette patterns.

In order to impart the illusion of depth and/or motion to a static image, the image must be made from more than one picture or frame. Typically, at least three, preferably four or more, pictures are interlaced with one another in any desired sequence to form a composite image or picture that when viewed through a lenticular lens, imparts the illusion of depth and/or motion to the viewer. In the creation of the composite picture, the base images or still pictures from which the composite is formed can consist of essentially anything that can be reduced to digital information or pixels, or anything that can be created electronically. Illustrative base images include, photographs, graphics, type, logos, animation, video, computer-generated or digital art, vignettes, tints, dimensional art, graphs, charts and similar information. Information not originally in electronic form can be converted to electronic form, as noted above, by any conventional technique.

Once all of the information that is to be included in the composite image is in electronic or pixel form, then an electronic page is created, typically through the use of any commercially available software package, e.g., QuarkXPress, manufactured and sold by Quark, Inc. of Denver, Colo. One page is created for each frame from which the composite image will be generated. Once each electronic page is assembled, then the pages are ordered into a desired sequence, i.e., the sequence that will impart the desired illusion to a viewer of the composite image once joined to a lenticular lens.

After the electronic pages are assembled and ordered, then preferably each is saved in a software file, e.g., in a file type such as POSTSCRIPT™. Saving is preferred because many page assembly programs do not allow for the direct conversion of the page to a rasterized file. However in those page assembly programs that allow for such direct conversion, this saving step can be omitted.

Whether saved or not, each assembled page is then rasterized, i.e., it is converted into a pixel array. This process can be accomplished through any one of a number of different software raster imaging processing (RIP's) programs, e.g., Freedom of Press Pro™ manufactured and sold by Color Age. Each frame is rasterized at a nonbinary pixel resolution or depth that corresponds to the resolution of the line count of the lenticular lens times the number of frames used to create the lithographic separation, i.e., the number of frames or pictures from which the composite image is created. This relationship can be expressed as $$\text{resolution} = 1 \text{ times } f$$

in which 1 is the line count of the lenticular lens and f is the number of frames in the lithographic separation. The line count of the lenticular lens can vary, and is typically between fifty and two hundred lines per lineal inch, preferably about seventy-five lines per lineal inch. "Line count" is the number of lenticules per lineal inch of the lenticular lens.

As here used, "nonbinary pixels" are pixels that have a depth of one or more, and that can be expressed as black, a value of grey or color, or white. "Binary pixels" are a subset of nonbinary pixels, and these have a depth of one and as such, can only be expressed as black or white, i.e. on or off.

The rasterized frames are then compressed such that the compression of each frame is a function of the number of frames in the lithographic separation. Compression is expressed as the reciprocal of the number of frames per line or lenticule, i.e., $$\text{Compression} = 1/f$$

where f is the number of frames in the composite image. This technique retains most, if not all, of the frame information, i.e., little or none of the frame information is lost (although some may be subject to minor degradation), and when viewed through a lenticule, most, if not all, of the original information in the frame is conveyed to the viewer in an essentially noncompressed state or in other words, in a state in which it has been expanded back to or near its original size.

The nonbinary pixels of the compressed frames are then converted to individual color plates of binary pixels. In conventional halftone screening, the number of dots per inch remain constant although the size of the dots can vary in relation to the tonal range density of the pixel depth that they represent. Single halftone dots are represented by a four pixel square array, each pixel a quadrant of the square. Typically a half-tone dot would have 256 possible values in which 256 is the equivalent of zero tone or clear, and zero is equivalent to solid or black. In a color halftone separation, the individual color plates must be aligned on angles of varying degree so as to avoid moire interference. Conventional angles are zero for yellow, 45 degrees for magenta, 75 degrees for cyan, and 105 degrees for black. Since angles can be interchanged or skewed as a whole, dots composed of multiple pixels can create moire problems (essentially the result of the repetitive nature of the dissimilar pixels). Moreover, the angling of the halftone screens can result in a rosette pattern which in turn can interfere with viewing through the lenticular lens creating screen interference.

In stochastic screening, the tonal quality of an image is represented by the frequency of the binary pixels which are all of like size. The stochastic image resolution is tuned so that each segment of a composite picture fits as precisely as possible within the width of the overlying lenticule. This tuned stochastic screen in which a direct relationship between pixels and lenticulas exists impart improved clarity and reproductive qualities to the composite image. This improvement is the absence of fuzzy or gray areas caused by the interpolation of the dot structure at points of transition from pixel to pixel, as well as the elimination of the rosette pattern which, as noted above, is a result of the merging of half-tone dots at off setting angles.

Since the stochastic screening method uses binary pixels, the need for registration between the lenticulas and the segments of the composite image for the purpose of maintaining the desired perspective is essentially eliminated. In other words, the lenticule can be shifted left or right, or up or down, relative to the underlying composite segment without adversely impacting the clarity of the image seen by the viewer through the lenticular lens. However, clarity still requires parallel registration between the lenticulas and the segments of the composite, e.g., in those instances in which the lenticule is a long cylinder and the composite image segment is a column, the edges of the lenticule remain parallel with the edges of the column. Moreover, because the image sequence of the composite image changes pixel by pixel, a point of transition of one image into another is created which in turn imparts the illusion to a viewer of an intermediate image. This illusion of an intermediate image imparts a more fluid motion than if the images were simply viewed in sequence, such as in a film.

After the nonbinary pixels of the compressed frames are converted to individual color plates of binary pixels, the individual frames are interlaced into a composite file. The frames are segmented, typically into columns, the number of segments a function of the number of lenticulas in the lenticular lens which will eventually be laminated to a substrate bearing the compressed composite image.

Correspondence exists between each column within the segment and also between each column and the frame itself. In other words, if the composite image consists of four base images and each base image is divided into twenty columns, typically each column of each base image of equal width, then the first segment of the composite image will consist of the first column of each base image, the second segment of the composite image will consist of the second column of each base image, and so forth through the twentieth segment of the composite image.

Moreover, the sequencing of each column within each segment of the composite image is consistent with the sequence of base images in the composite image. For example, if the sequence of base images in the composite image is A, B, C and D, then this is the sequence of ordering of the columns in each individual segment of the composite image. Thus in the first segment of the composite image, the first column of base image A is first, followed by the first column of base image B, followed by the first column of base image C, and finally followed by the first column of base image D.

The interlacing can be accomplished either by manual manipulation of the pixels, or through the use of a software program designed for such interlacing.

After the composite picture has been assembled, it is outputted at a resolution corresponding to its electronic resolution, and at a size that corresponds to the lenticular lens which will eventually overlay it. The composite image can be outputted to any high-resolution outputting device which can eventually create a lithographic separation, e.g., a film, proof, etc. This separation can then be used to create the print to which the lenticular lens can be laminated by any conventional technique. In one embodiment of this invention, the composite image is printed directly to the reverse or back side of the lenticular lens such that the image is displayed to a viewer when subjected to backlighting.

Although the construction of a frame has been described from the perspective of columns, frames can also be constructed from the perspective of rows or other groups of pixels if particular effects are desired. The digital base image is a series of pixels that can be represented as a grid, and any segment of that grid can serve as a building block for a frame. For example, creating motion from an array of rows allows the composite image to be displayed in any perspective forward of the viewer, e.g. in an overhead, on a wall or billboard, in a floor panel, etc. As the viewer moves toward the display, regardless of angle but preferably from a relatively perpendicular approach, the viewer perceives the intended motion.

This invention can produce lithographs of photographic quality that impart the illusion of motion and/or depth to a viewer. These lithographs have many possible applications such as pages with animations that move,, movies condensed to a series of scenes that can be played repeatedly by the viewer, and point of purchase displays incorporating motion graphics, images and animation.

As a further illustration of the lithographs of this invention and the method of their preparation, reference is made to FIG. 1 in which four base images are illustrated, i.e., a circle, a rectangle, a square and a triangle. Each image is converted to digital information or pixels by any conventional technique and once converted, can be electronically retouched and manipulated as desired. These images are then sequenced and/or merged with other elements such as type, graphics, tints, and the like (not shown) into a composite image or electronic page by any conventional technique.

Figure 2:
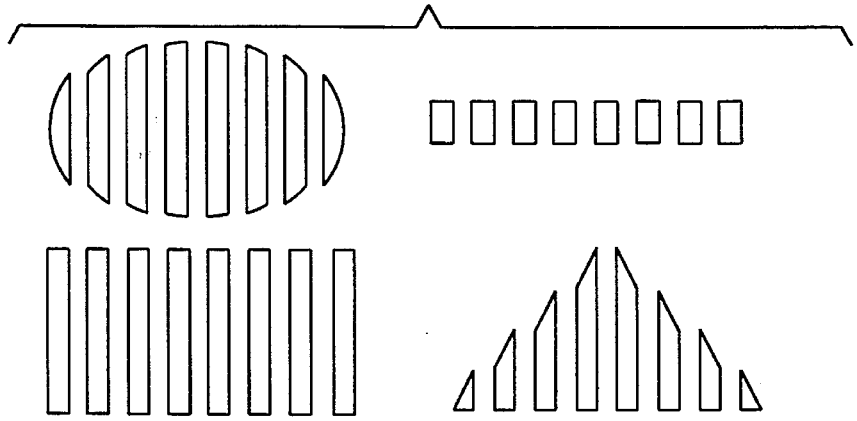
FIG. 2 is the sequenced base images of FIG. 1 segmented into columns of equal width.
Figure 3:
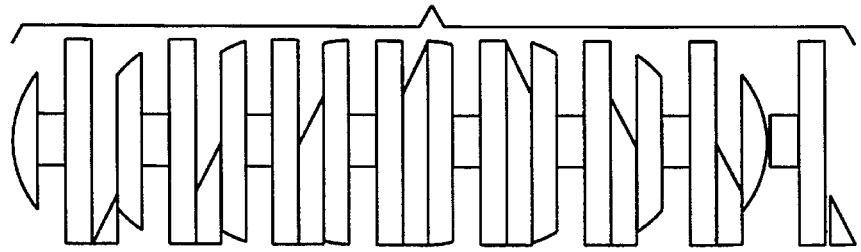
FIG. 3 is an illustration of a sequence of frames comprising segments of the base images illustrated in FIGS. 1 and 2.

Each base image is then rasterized, compressed and converted from nonbinary pixels to binary pixels (these steps not illustrated by the Figures). Each frame is then segmented as illustrated in FIG. 2, and the individual segments then ordered into segments of the composite image. As illustrated in FIG. 3, the first segment of the composite image consists of the first segment of each of the base images in the order in which the base images are sequenced. The second segment of the composite image consists of the second segment of each of the base images, each segment of each base image positioned in the sequence in which the base images are ordered. This pattern repeats itself across composite image.

Figure 4:
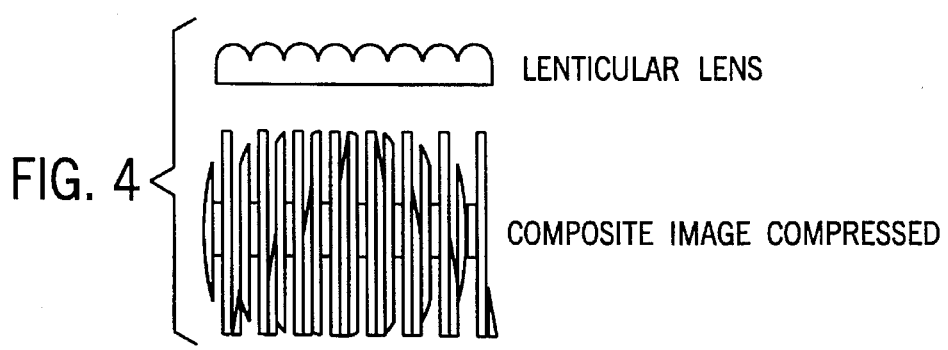
FIG. 4 is a schematic depiction of the frames of FIG. 3 compressed to register with the lenticulas of a lenticular lens.

FIG. 4 illustrates that each segment of the composite image is in a compressed state such that it corresponds to the width of an individual lenticule of the overlying lenticular lens. The compressed composite image is then outputted to a film or digital proof from which the composite image is printed onto any suitable substrate, e.g., paper, metal, plastic, etc. The lenticular lens is then laminated to the image-bearing surface of the substrate such that each lenticule is in substantial parallel registration with each segment of the base image. Alternatively, the composite image is printed directly on the reverse or back side of the lenticular lens, again with each lenticule in substantial parallel registration with each segment of the composite image.

Although only a few embodiments of the present invention have been described above in detail, those skilled in the art will appreciate that many additions and modifications can be made without departing from the, spirit and scope of the invention. These and all other modifications are intended to be included within the scope of the present invention as described in the following claims.

What is claimed is:

1. A method of producing a multidimensional lithographic separation void of moire and screen interference, the separation comprising a plurality of segments created from a plurality of electronic frames and from which a multidimensional lithograph can be produced and printed on a lenticular lens of a predetermined line count, the method comprising the steps of:
   A. Creating a plurality of electronic frames;
   B. Ordering the frames into a desired sequence;
   C. Rasterizing each frame at a nonbinary pixel resolution according to the formula $$\text{resolution} = 1 \text{ times } f$$

in which 1 is the lenticular line count and f is the number frames in the lithographic separation;
   D. Compressing each frame such that each frame is compressed according to the formula $$\text{Compression} = 1/f$$

in which f is the number of frames in the separation;
   E. Converting the nonbinary pixels of the compressed frames to individual color plates of binary pixels;
   F. Interlacing the frames in the desired sequence of step (B);
   G. Outputting the interlaced frames to an imaging device;
   H. Producing a lithographic separation from the imaging device of step G; and
   I. Printing a multidimensional lithograph directly on the lenticular lens from the lithographic separation.

2. A method of producing a multidimensional image void of moire and screen interference, the image comprising a plurality of segments created from a plurality of electronic frames and from which a multidimensional image can be produced and printed on a lenticular lens of a predetermined line count, the method comprising the steps of:
   A. Creating a plurality of electronic frames;
   B. Ordering the frames into a desired sequence;
   C. Rasterizing each frame at a nonbinary pixel resolution according to the formula $$\text{resolution} = 1 \text{ times } f$$

in which 1 is the lenticular line count and f is the number frames in the image;
   D. Compressing each frame such that each frame is compressed according to the formula $$\text{Compression} = 1/f$$

in which f is the number of frames in the image;
   E. Converting the nonbinary pixels of the compressed frames to individual color plates of binary pixels;
   F. Interlacing the frames in the desired sequence of step (B);
   G. Outputting the interlaced frames to an imaging device; and
   H. Producing an image from the imaging device of step G.

3. The method of claim 2, further comprising the step of:
   I. Printing the multidimensional image directly on the lenticular lens from the image.

* * * * *